US010134955B2

United States Patent
Shioji et al.

(10) Patent No.: US 10,134,955 B2
(45) Date of Patent: Nov. 20, 2018

(54) LIGHT EMITTING ELEMENT AND METHOD OF MANUFACTURING THE SAME

(71) Applicant: NICHIA CORPORATION, Anan-shi (JP)

(72) Inventors: Shuji Shioji, Komatsushima (JP); Masafumi Kuramoto, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/390,537

(22) Filed: Dec. 26, 2016

(65) Prior Publication Data
US 2017/0186916 A1    Jun. 29, 2017

(30) Foreign Application Priority Data
Dec. 26, 2015    (JP) .................... 2015-255467

(51) Int. Cl.
| H01L 33/60 | (2010.01) |
| H01L 33/62 | (2010.01) |
| H01L 29/22 | (2006.01) |
| H01L 33/46 | (2010.01) |
| H01L 33/40 | (2010.01) |
| H01L 33/48 | (2010.01) |
| H01L 33/38 | (2010.01) |

(52) U.S. Cl.
CPC .......... H01L 33/405 (2013.01); H01L 33/46 (2013.01); H01L 33/486 (2013.01); *H01L 33/38* (2013.01); *H01L 2933/0016* (2013.01); *H01L 2933/0025* (2013.01)

(58) Field of Classification Search
CPC ..... H02S 40/22; H01L 31/056; G02B 5/0284; C25D 13/02; C25D 7/08; B29C 67/20; B05D 3/0254; B05D 1/305; B05D 1/28; B05D 1/18; B05D 1/02; B05D 1/005
See application file for complete search history.

(56) References Cited

U.S. PATENT DOCUMENTS

| 2008/0254567 A1 | 10/2008 | Konno |
| 2008/0258174 A1* | 10/2008 | Seong ............. H01B 1/08 257/184 |
| 2009/0044858 A1 | 2/2009 | Wang et al. |
| 2009/0294784 A1 | 12/2009 | Nakahara et al. |
| 2011/0155240 A1 | 6/2011 | Wang et al. |

(Continued)

FOREIGN PATENT DOCUMENTS

| JP | 2001-210845 | 8/2001 |
| JP | 2005-051137 | 2/2005 |

(Continued)

*Primary Examiner* — Brian Turner
(74) *Attorney, Agent, or Firm* — Mori & Ward, LLP

(57) ABSTRACT

A light emitting element includes a semiconductor stacked body, an oxide film, and a reflecting film. The semiconductor stacked body has a body surface. The oxide film has an upper surface and a bottom surface opposite to the upper surface. The oxide film is provided on the semiconductor stacked body such that the bottom surface of the oxide film is opposite to the body surface of the semiconductor stacked body. The reflecting film is provided on the oxide film to be in contact with the upper surface of the oxide film and includes silver and oxide nanoparticles.

18 Claims, 11 Drawing Sheets

(56) References Cited

U.S. PATENT DOCUMENTS

| | | |
|---|---|---|
| 2013/0234271 A1 | 9/2013 | Carroll et al. |
| 2014/0124732 A1* | 5/2014 | Cha .................. H01L 33/24 257/13 |
| 2014/0182675 A1* | 7/2014 | Tokuoka .......... H01L 31/02243 136/256 |
| 2014/0197435 A1* | 7/2014 | Maute ................ H01L 33/382 257/98 |
| 2014/0313574 A1* | 10/2014 | Bills .................. H02S 40/22 359/359 |
| 2014/0342104 A1 | 11/2014 | Tauchi et al. |
| 2015/0155456 A1 | 6/2015 | Kuramoto et al. |
| 2015/0287893 A1* | 10/2015 | Huang ................ H01L 33/507 257/88 |
| 2016/0247988 A1 | 8/2016 | Shioji et al. |

FOREIGN PATENT DOCUMENTS

| | | |
|---|---|---|
| JP | 2005-311272 | 11/2005 |
| JP | 2005-325386 | 11/2005 |
| JP | 2006-108161 | 4/2006 |
| JP | 2006-120913 | 5/2006 |
| JP | 2006-165467 | 6/2006 |
| JP | 2006-302890 | 11/2006 |
| JP | 2006-302891 | 11/2006 |
| JP | 2006-332032 | 12/2006 |
| JP | 2007-134415 | 5/2007 |
| JP | 2007-258323 | 10/2007 |
| JP | 2009-519608 | 5/2009 |
| JP | 2010-153825 | 7/2010 |
| JP | 2010-524257 | 7/2010 |
| JP | 2011-035275 | 2/2011 |
| JP | 2011-222603 | 11/2011 |
| JP | 2012-062564 | 3/2012 |
| JP | 2013-065856 | 4/2013 |
| JP | 2013-149616 | 8/2013 |
| JP | 2013-149911 | 8/2013 |
| JP | 2013-151735 | 8/2013 |
| JP | 2014-093509 | 5/2014 |
| JP | 2015-106642 | 6/2015 |
| JP | 2015-144245 | 8/2015 |

* cited by examiner

LIGHT EMITTING ELEMENT AND METHOD OF MANUFACTURING THE SAME

CROSS-REFERENCE TO RELATED APPLICATIONS

The present application claims priority under 35 U.S.C. § 119 to Japanese Patent Application No. 2015-255467, filed Dec. 26, 2015. The contents of this application are incorporated herein by reference in their entirety.

BACKGROUND OF THE INVENTION

Field of the Invention

The present invention relates to a light emitting element and a method of manufacturing the light emitting element.

Discussion of the Background

For example, Japanese Unexamined Patent Application Publication No. 2006-120913 discloses a flip-chip semiconductor light emitting element in which on a contact layer as an uppermost layer of a semiconductor layer are formed a transparent electrically conductive film, a multilayer reflecting film (insulating protective thin film in Japanese Unexamined Patent Application Publication No. 2006-108161) formed of silicon oxide, silicon nitride, and the like, a reflecting film formed of silver or a silver alloy, and an electrode layer in this order.

SUMMARY OF THE INVENTION

According to one aspect of the present invention, a light emitting element includes a semiconductor stacked body, an oxide film, and a reflecting film. The semiconductor stacked body has a body surface. The oxide film has an upper surface and a bottom surface opposite to the upper surface. The oxide film is provided on the semiconductor stacked body such that the bottom surface of the oxide film is opposite to the body surface of the semiconductor stacked body. The reflecting film is provided on the oxide film to be in contact with the upper surface of the oxide film and includes silver and oxide nanoparticles.

According to another aspect of the present invention, a light emitting element includes a semiconductor stacked body, an nitride film, and a reflecting film. The semiconductor stacked body has a body surface. The nitride film has an upper surface and a bottom surface opposite to the upper surface. The nitride film is provided on the semiconductor stacked body such that the bottom surface of the nitride film is opposite to the body surface of the semiconductor stacked body. The reflecting film is provided on the nitride film to be in contact with the upper surface of the nitride film and includes silver and nitride nanoparticles.

According to further aspect of the present invention, a method of manufacturing a light emitting element includes providing a semiconductor stacked body having a body surface. An oxide film is provided on the semiconductor stacked body such that a bottom surface of the oxide film is opposite to the body surface of the semiconductor stacked body. A reflecting film is provided on the oxide film to be in contact with an upper surface of the oxide film opposite to the bottom surface of the oxide film by co-sputtering or co-vapor deposition of silver and an oxide.

According to further aspect of the present invention, a method of manufacturing a light emitting element includes providing a semiconductor stacked body having a body surface. An oxide film is provided on the semiconductor stacked body such that a bottom surface of the oxide film is opposite to the body surface of the semiconductor stacked body. A reflecting film is provided on the oxide film to be in contact with an upper surface of the oxide film opposite to the bottom surface of the oxide film by discretely attaching oxide nanoparticles to the upper surface of the oxide film by sputtering or vapor deposition and by forming a silver film covering the oxide nanoparticles.

According to further aspect of the present invention, a method of manufacturing a light emitting element includes providing a semiconductor stacked body having a body surface. A nitride film is provided on the semiconductor stacked body such that a bottom surface of the nitride film is opposite to the body surface of the semiconductor stacked body. A reflecting film is provided on the nitride film to be in contact with an upper surface of the nitride film opposite to the bottom surface of the nitride film by co-sputtering or co-vapor deposition of silver and a nitride.

According to further aspect of the present invention, a method of manufacturing a light emitting element includes providing a semiconductor stacked body having a body surface. A nitride film is provided on the semiconductor stacked body such that a bottom surface of the nitride film is opposite to the body surface of the semiconductor stacked body. A reflecting film is provided on the nitride film to be in contact with an upper surface of the nitride film opposite to the bottom surface of the nitride film by discretely attaching nitride nanoparticles to the upper surface of the nitride film by sputtering or vapor deposition and by forming a silver film covering the nitride nanoparticles.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
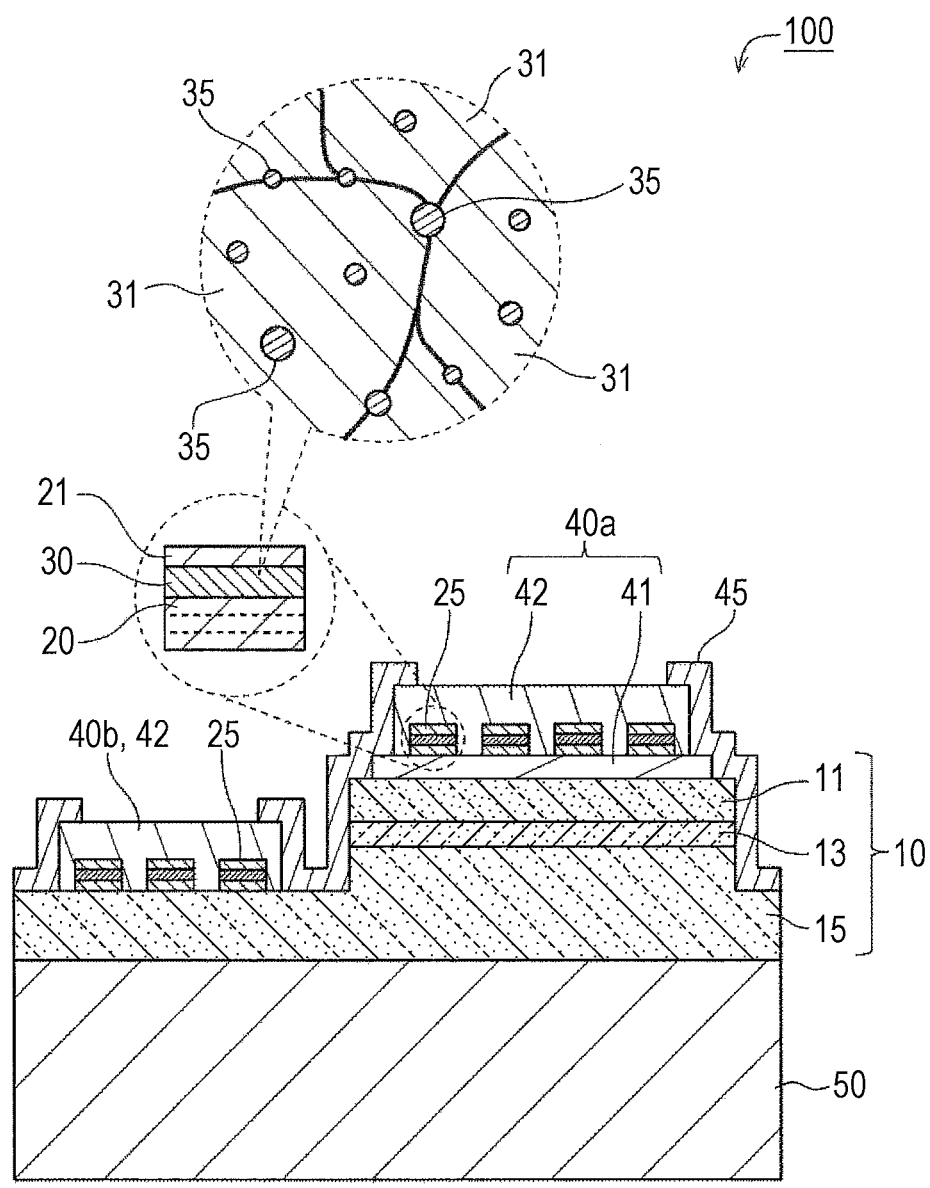
FIG. 1 is a schematic sectional view of a light emitting element according an embodiment of the present invention.

The embodiments will now be described with reference to the accompanying drawings, wherein like reference numerals designate corresponding or identical elements throughout the various drawings.

Hereinafter, embodiments of the present invention are described with appropriate reference to drawings. However, the light emitting elements and the methods of manufacturing the light emitting elements that are described below are for embodying technical ideas of the present invention, and the present invention is not limited to those described below unless otherwise specifically described. The size, positional relationship, and the like of members illustrated in the drawings are sometimes exaggerated for clear description.

The "upper" and "lower" directions of a light emitting element described below are based on the state illustrated in FIG. 1. Therefore, for example, when a light emitting element according to an embodiment of the present invention is flip-chip mounted, the "upper" and "lower" directions of the light emitting element become opposite.

First Embodiment

FIG. 1 is a schematic sectional view of a light emitting element 100 according a first embodiment. As illustrated in FIG. 1, the light emitting element 100 according to the first embodiment includes a semiconductor stacked body 10, an oxide film 20, and a reflecting film 30. The light emitting element 100 further includes electrodes 40a and 40b, a protective film 45, and a substrate 50. The oxide film 20 is provided on the semiconductor stacked body 10. The reflecting film 30 is provided in contact with the oxide film 20. The reflecting film 30 includes silver as a main component, and oxide nanoparticles 35.

In more detail, the light emitting element 100 is a flip-chip light emitting diode (LED) element. The semiconductor stacked body 10 is provided on the substrate 50. The semiconductor stacked body 10 includes (from a substrate 50 side) a second electrically conductive semiconductor layer 15, an active layer 13, and a first electrically conductive semiconductor layer 11 stacked in this order. Here, the second electrically conductive semiconductor layer is an n-type, and the first electrically conductive semiconductor layer is a p-type, however, the second electrically conductive semiconductor layer may also be a p-type, and the first electrically conductive semiconductor layer may also be an n-type. The first electrically conductive semiconductor layer 11 and the second electrically conductive semiconductor layer 15 are acceptable even if configured as a stacked body of a plurality of layers as long as the semiconductor layers show the electrically conductive types, respectively. The semiconductor stacked body 10 includes, in a planar view, an upper surface region of the first electrically conductive semiconductor layer 11 and an upper surface region of the second electrically conductive semiconductor layer 15. Such a structure can be obtained by, for example, partially removing the first electrically conductive semiconductor layer 11 and the active layer 13 by etching from above to expose a part of the upper surface of the second electrically conductive semiconductor layer 15. The electrode may be formed of a first electrode portion (e.g., an ohmic electrode portion) in contact with the semiconductor stacked body, and a second electrode portion (e.g., a pad electrode portion) suitable for bonding with the outside. A first electrode portion 41 of the electrode (first electrically conductive electrode) 40a is provided on an upper surface region of the first electrically conductive semiconductor layer 11. The first electrode portion 41 is formed of a light-transmissive electrically conductive film. On the first electrode portion 41 are provided light reflecting structure bodies 25 having opening portions. The light reflecting structure bodies 25 are provided, for example, in a grid where the opening portions are regularly scattered. A second electrode portion 42 of the electrode 40a is provided over the light reflecting structure bodies 25 in contact with the light reflecting structure bodies and is provided in contact with the first electrode portion 41 through the opening portions of the light reflecting structure bodies 25. Each of the light reflecting structure bodies 25 includes a dielectric multilayer film (distributed Bragg reflector (DBR)) including the oxide film 20, the reflecting film 30, and an oxide film 21 stacked in this order. An example of the dielectric multilayer film is a stacked body of a silicon oxide film and a niobium oxide film. The light reflecting structure bodies 25 having opening portions which are the same as the light reflecting structure bodies on the first electrically conductive semiconductor layer are also provided on an upper surface region of the second electrically conductive semiconductor layer 15. The electrode (second electrically conductive electrode) 40b is provided over the light reflecting structure bodies 25 in contact with the light reflecting structure bodies and is provided in contact with an upper surface region of the second electrically conductive semiconductor layer 15 through the opening portions of the light reflecting structure bodies 25. The protective film 45 is provided in contact with parts of the semiconductor stacked body 10 and the electrodes 40a and 40b.

The presence of the nanoparticles 35 in the reflecting film 30 as described above can increase the adhesion of the reflecting film 30 to the oxide film 20 (hereinafter, the same for the oxide film 21) so that a highly reliable light emitting element can be obtained. The reflecting film 30 can give such an effect at low cost and allows simplification of the film (layer) structure between the oxide film and the reflecting film as compared with the case in which a high adhesion film (layer) or the like is interposed between the oxide film and the reflecting film. Accordingly, a light emitting element excellent in light extraction efficiency can be obtained without a light loss caused by an interposed film.

Further, the presence of the nanoparticles 35 in the reflecting film 30 can cause a pinning effect to reduce the growth of crystal grains of silver as a main component of the reflecting film 30, or silver crystal grains 31 (hereinafter, sometimes simply abbreviated as "crystal grains 31"). The pinning effect can reduce the growth of the crystal grains 31 caused by a heat history in an assembling process of the light emitting element to allow the reflecting film 30 to retain the smoothness of the surface of the reflecting film and reduce the generation of voids in the reflecting film 30. Accordingly, the reflecting film 30 is likely to retain a high reflectivity and a high heat releasing property. Further, the nanoparticles 35 can be expected to have an action of reducing the migration of silver in the reflecting film 30.

Figure 2A:
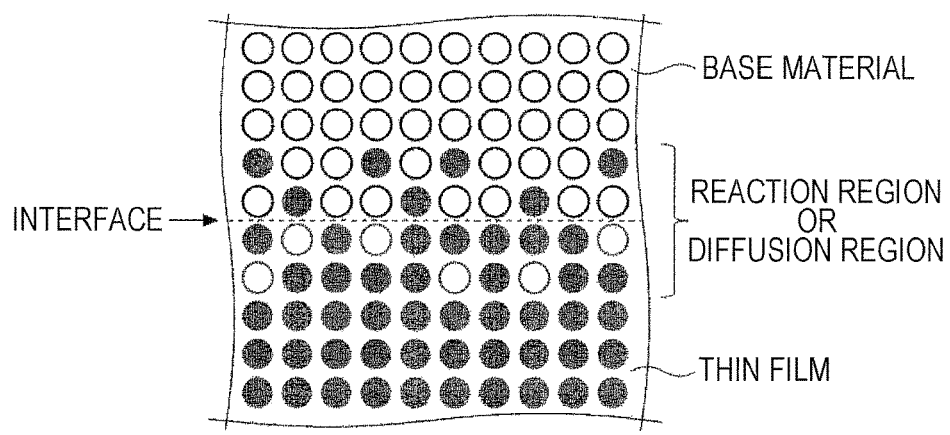
FIG. 2A is a schematic diagram that illustrates the bonding between a base material and a thin film.
Figure 2B:
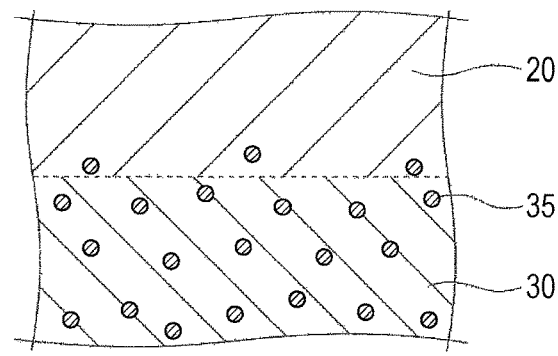
FIG. 2B is a schematic diagram that illustrates the bonding between an oxide film and a reflecting film according to an embodiment of the present invention.
Figure 2C:
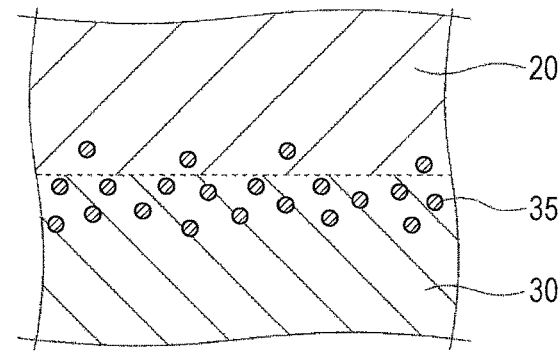
FIG. 2C is a schematic diagram that illustrates the bonding between an oxide film and a reflecting film according to an embodiment of the present invention.

FIG. 2A is a schematic diagram that illustrates the bonding between a base material and a thin film. FIGS. 2B and 2C are schematic diagrams that illustrate the bonding between the oxide film and the reflecting film according to the first embodiment. Generally, when a thin film is formed on a base material, a reaction region and a diffusion region are formed by the generation of a compound and by atomic diffusion, respectively, in the vicinity of the interface between the base material and the thin film to increase the adhesion between the base material and the thin film, as illustrated in FIG. 2A. For example, when a thin film of a metal likely to oxidize is formed on an oxide base material, a reaction region in which an oxide of the metal as a thin film component is generated is likely to be formed in the vicinity of the interface so that the adhesion is easily obtained. On the other hand, when a thin film of a metal less likely to oxidize is formed on an oxide base material, such a reaction region is less likely to be formed so that it is difficult to obtain the adhesion.

In order to overcome the difficulty, it is considered that the oxide nanoparticles 35 are incorporated in the reflecting film 30 as illustrated in FIG. 2B. It is presumable that the incorporation allows quasi formation of the reaction region in the vicinity of the interface between the oxide film 20 and the reflecting film 30 to increase the adhesion of the reflecting film 30 to the oxide film 20.

The nanoparticles 35 are preferably present at least in the vicinity of the interface between the oxide film 20 and the reflecting film 30 from the viewpoint of increasing the adhesion of the reflecting film 30 to the oxide film 20. As illustrated in FIG. 2B, when the nanoparticles 35 are scattered over the whole region of the reflecting film 30, the crystal growth is likely to be reduced over the whole region of the reflecting film 30. On the other hand, as illustrated in FIG. 2C, when many of the nanoparticles 35 are present on an oxide film 20 side in the reflecting film 30, the nanoparticles 35 can be efficiently used to increase the adhesion between the oxide film 20 and the reflecting film 30. Particularly when the nanoparticles 35 are, in the reflecting film 30, unevenly or locally present in the vicinity of the interface between the oxide film 20 and the reflecting film 30, the decrease in the reflectivity and rise in electrical resistance of the reflecting film 30 can be reduced while the adhesion between the oxide film 20 and the reflecting film 30 is increased.

Figure 3A:
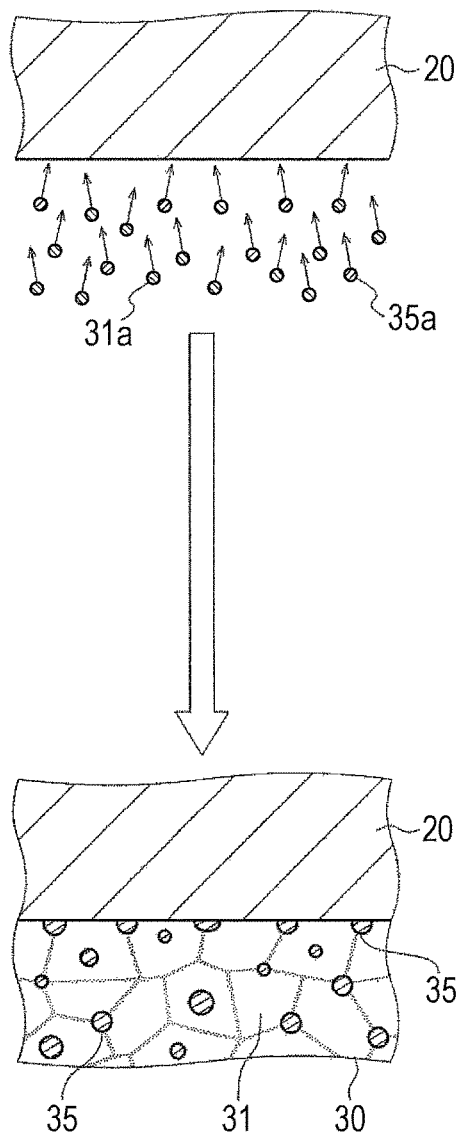
FIG. 3A is a schematic diagram that illustrates an example of a method of manufacturing a light emitting element according to an embodiment of the present invention.
Figure 3B:
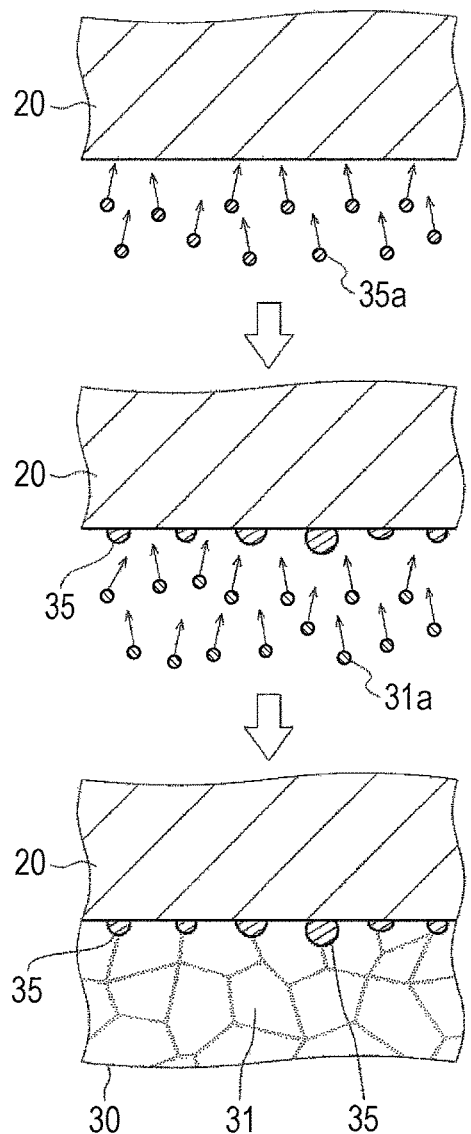
FIG. 3B is a schematic diagram that illustrates an example of a method of manufacturing a light emitting element according to an embodiment of the present invention.

FIGS. 3A and 3B are schematic diagrams that illustrate the light emitting element according to the first embodiment and an example of a method of manufacturing the light emitting element. As illustrated in FIG. 3A, an example of the method of manufacturing the light emitting element 100 according to the first embodiment includes the steps of: forming the semiconductor stacked body 10; forming the oxide film 20 on the semiconductor stacked body 10; and forming the reflecting film 30 in contact with the oxide film 20 by co-sputtering or co-vapor deposition of silver and an oxide. The nanoparticles 35 can be scattered over the whole region in the reflecting film 30 by simultaneously supplying a silver raw material 31a and a nanoparticle raw material 35a onto the oxide film 20. In this case, the nanoparticles 35 include, in addition to particles attached to the surface of the oxide film 20, particles in the silver crystal grains 31 and in a grain boundary of silver.

As illustrated in FIG. 3B, another example of the method of manufacturing the light emitting element 100 according to the first embodiment includes the steps of: forming the semiconductor stacked body 10; forming the oxide film 20 on the semiconductor stacked body 10; and forming the reflecting film 30 in contact with the oxide film 20 by discretely attaching the oxide nanoparticles 35 to the surface of the oxide film 20 by sputtering or vapor deposition, followed by formation of a silver film covering the nanoparticles 35. The nanoparticles 35 in the reflecting film 30 can be made into particles discretely attached to the surface of the oxide film 20 by first supplying the nanoparticle raw material 35a and subsequently supplying the silver material 31a onto the oxide film 20, respectively and separately. This is an example of a form in which the nanoparticles 35 in the reflecting film 30 are locally present in the vicinity of the interface between the reflecting film 30 and the oxide film 20 as described above. In this case, a film having a thickness of, for example, less than 10 nm, preferably less than 5 nm is formed for discrete attachment of the nanoparticles 35 to the surface of the oxide film 20, so that the nanoparticles 35 can be formed not in a film (layer) form covering the whole region of the surface of the oxide film 20 but discretely, i.e., in a form of a plurality of beads.

Hereinafter, a preferable form of the reflection film 30 is described.

As illustrated in FIG. 1, the nanoparticles 35 are preferably present in at least a grain boundary of the reflecting film 30. The presence of the nanoparticles 35 in a grain boundary of the reflecting film 30 is likely to reduce the grain boundary migration by the pinning effect and can effectively reduce the growth of the crystal grains 31. Further, such presence of the nanoparticles 35 can prevent an atom of another metal such as copper from diffusing a grain boundary of the reflecting film 30. Further, such presence of the nanoparticles 35 can prevent oxygen in air from intruding into the reflecting film 30 to diffuse a grain boundary. Accordingly, the reflecting film 30 can retain a high reflectivity and reduce the peeling from the oxide film 20 even having undergone an assembling process and continuous driving of the light emitting element and the light emitting device, resulting in the reflecting film excellent in reliability. Further, the reflecting film 30 can give such effects at low cost as compared with the case in which a barrier layer is separately formed, and allows simplification of the upper/lower layer structure of the reflecting film 30.

The nanoparticles 35 are preferably at least a substance selected from silicon oxide, aluminum oxide, zirconium oxide, titanium oxide, zinc oxide, magnesium oxide, gallium oxide, tantalum oxide, niobium oxide, bismuth oxide, yttrium oxide, iridium oxide, indium oxide, tin oxide, nickel oxide, ITO, IZO, AZO, GZO, and FTO. Hafnium oxide is also preferable. The nanoparticles 35 are also preferably an oxide of at least an element selected from Group 4 elements, Group 10 elements, Group 12 elements, Group 13 elements, and Group 14 elements. Especially, silicon oxide, aluminum oxide, zirconium oxide, and titanium oxide are readily available and relatively cheap.

The content of the nanoparticles 35 in the reflecting film 30 is sufficient as long as it is larger than 0 wt % without being limited by an upper limit value, and is, for example, 0.2 wt % or more, preferably 0.5 wt % or more, more preferably 1 wt % or more, from the viewpoint of the adhesion to the oxide film 20. The content of the nanoparticles 35 in the reflecting film 30 is, for example, 5 wt % or less, preferably 4 wt % or less, more preferably 2.5 wt % or less from the viewpoint of the reflectivity (initial reflectivity) of the reflecting film 30.

The average particle size of the nanoparticles 35 is not particularly limited but is preferably 0.1 nm or more and 100 um or less, may further be 0.1 nm or more and less than 10 nm. Thus, the nanoparticles 35 can be scattered in the reflecting film 30 in great numbers and is likely to reduce the growth of the crystal grains 31 in a small addition amount. The average particle size of the nanoparticles 35 can be defined by $D_{50}$. The average particle size of the nanoparticles 35 can be measured by, for example, a laser diffraction/scattering method, an image analysis method (scanning electron microscope (SEM), transmission electron microscope (TEM)), dynamic light scattering, and a small angle X-ray scattering technique. Especially, the image analysis method is preferable. The image analysis method complies with, for example, JIS Z 8827-1:2008.

The shape of the nanoparticles 35 is not particularly limited, and examples of the shape include a spherical shape, an irregular crushed shape, a needle shape, a column shape, a plate shape (including a scale shape), a fiber shape, and a branch shape. Especially, with the nanoparticles 35 being spherical, even when light enters into the nanoparticles 35 that are relatively large to the level that the nanoparticles interfere with visible light, total reflection can be reduced, allowing prompt extraction of light, so that the reflecting film 30 excellent in the reflectivity can easily be obtained. The shape referred to herein is not intended to specify the shape of all the nanoparticles 35, but it is sufficient if the nanoparticles 35 include nanoparticles having the shape, and the nanoparticles 35 include preferably 30% or more, more preferably 50% or more of nanoparticles having the shape, relative to the entire nanoparticles 35.

With the oxide film 20 having light-transmissivity, a light reflection function of the reflecting film 30 is easily exhibited. Further, the nanoparticles 35 preferably have light-transmissivity. Although it is considered that a dissimilar metal is added for a solute drag effect as a method of reducing the crystal growth of the reflecting film caused by a heat history, the dissimilar metal is relatively high in light absorbency and causes an unignorable light loss when the light scattering in the light emitting device is considered. The nanoparticles 35 having light-transmissivity, however, can minimize such a light loss.

With the oxide film 20 having electrical conductivity, uniform in-plane power supply in the semiconductor stacked body 10 is easily achieved and the power efficiency is easily increased. Further, with the nanoparticles 35 having electrical conductivity, the rise in electrical resistance of the reflecting film 30 can be reduced.

The oxide film 20 is preferably at least a substance selected from silicon oxide, aluminum oxide, zirconium oxide, titanium oxide, zinc oxide, magnesium oxide, gallium oxide, tantalum oxide, niobium oxide, bismuth oxide, yttrium oxide, iridium oxide, indium oxide, tin oxide, nickel oxide, hafnium oxide, ITO, IZO, AZO, GZO, and FTO. Especially, any one of silicon oxide, aluminum oxide, niobium oxide, and ITO is preferable, and silicon oxide is most preferable.

The method of forming the reflecting film 30 is not particularly limited, and examples of the method include sputtering and vapor deposition. Any thickness can be selected for the light reflecting film 30, and the thickness is, for example 0.03 μm or more and 5.0 μm or less, preferably 0.05 μm or more and 3.0 μm or less, more preferably 0.1 μm or more and 1.0 μm or less.

Figure 4:
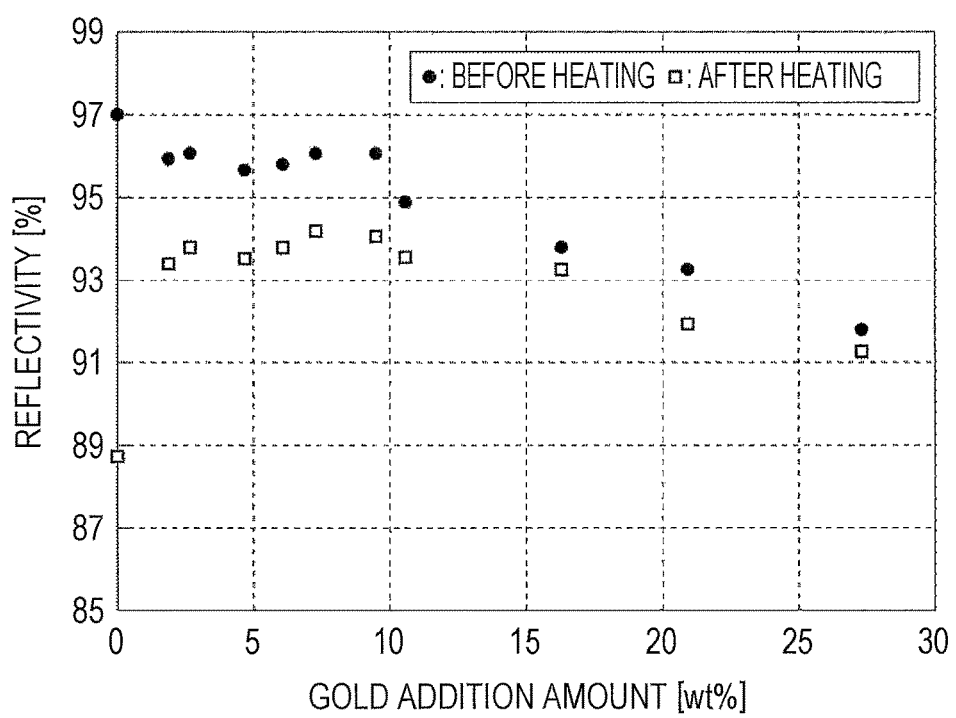
FIG. 4 is a graph that indicates the relationship between the amount of gold added to a silver film and the reflectivity.

Silver as a main component of the reflecting film 30 is excellent in light reflectiveness, is especially the largest among metals in the reflectivity of a visible wavelength range, and has best performance among metals also in thermal conductivity and electrical resistance. Silver not only forms a solid solution or an intermetallic compound with an impurity of a dissimilar metal but also forms a compound with an impurity of a nonmetal such as selenium or sulfur. These impurities encourage phenomena of reducing the crystal grown, referred to as the pinning effect or the solute drag effect, but become factors to decrease the reflectivity of the silver film. Accordingly, it is preferable to retain the purity of silver at a certain high level for obtaining a reflectivity equivalent to the reflectivity of pure silver. For example, aluminum can easily give the adhesion to the oxide film and is a metal that has the highest reflectivity next after silver. Therefore, the maximum value (upper limit) of the amount of an impurity added to the silver film can be set to such an addition amount as to make the reflectivity of the silver film (referred to as a film including silver as a main component after addition of the impurity) equal to the reflectivity of aluminum. In other words, silver preferably has a purity that allows the film including silver as a main component to retain a reflectivity equal to or higher than the reflectivity of aluminum. While the loss by light absorption is different, even with the same addition amount, according to the chemical species of impurities, gold can form a complete solid solution with silver, can take a uniform metal structure without segregation of, for example, an intermetallic compound, is less likely to vary in the reflectivity, and is an impurity that can be added in a great amount. The substantial maximum value of the amount of an impurity added to the silver film can be defined by taking gold as an example. FIG. 4 is a graph that indicates the relationship between the amount of gold added to the silver film and the reflectivity. In more detail, FIG. 4 is a graph that indicates the relationship between the amount of gold added to the silver film formed by sputtering and the reflectivity (wavelength 450 nm) before and after a heat treatment. The conditions of the heat treatment are 250° C. in the atmosphere for 2 hours. As understood from FIG. 4, a high reflectivity of about 96% is retained until a gold addition amount of 9 wt %, and it is understood that the purity of silver is preferably 91% or more. Further, the purity of silver is more preferably 99% or more for obtaining a reflectivity equivalent to the reflectivity of pure silver. The purity of silver means the proportion of silver except an impurity that forms a compound by alloying or reaction with silver. The nanoparticles 35 are not included in the impurity.

Silver is a polycrystalline body, and has the surface thereof roughened, increases diffused reflection, and visually looks as though having undergone whitening as the crystal grains of silver sterically grow. Even high purity silver has a little light absorption, and therefore, the reflectivity decreases by increase of light absorption for diffused reflection. The silver average particle size is decreased to such a level as to eliminate the interference with visible light for making the surface of the silver film a mirror surface or a surface having a glossiness of 1.5 or more. Specifically, the mirror surface or a surface having a glossiness of 1.5 or more can be achieved by making the average particle size less than 50 nm, which is much less than a fourth of 380 nm as the shortest wavelength of visible light. In the case of, for example, electrolytic plating, however, it is necessary to increase the concentration of an impurity in the silver film to reduce the crystallinity of silver for decreasing the average particle size. The light absorption increases along with the concentration of an impurity so that even when a mirror surface, i.e., a surface having a high glossiness is attained by decreasing the average particle size, the reflectivity decreases. Further, in the case of sputtering, the small average particle size can be attained only under conditions that are less economical than the electrolytic plating. For the reasons described above, the silver average particle size is preferably 50 nm or more and 1.0 µm or less, more preferably 50 nm or more and 0.5 µm or less.

Second Embodiment

In a light emitting element according to a second embodiment and a method of manufacturing the light emitting element, the oxide film and the nanoparticles in the light emitting element according to the first embodiment and the method of manufacturing the light emitting element are changed to a nitride. Such a light emitting element according to the second embodiment and such a method of manufacturing the light emitting element can also exhibit the same actions and effects to the actions and effects of the first embodiment.

A nitride film of the second embodiment is preferably at least a substance selected from silicon nitride, aluminum nitride, zirconium nitride, titanium nitride, zinc nitride, magnesium nitride, gallium nitride, tantalum nitride, niobium nitride, bismuth nitride, yttrium nitride, iridium nitride, indium nitride, tin nitride, nickel nitride, and hafnium nitride. Especially, any one of silicon nitride, aluminum nitride, and gallium nitride is preferable, and silicon nitride is most preferable.

Nanoparticles of the second embodiment is preferably at least a substance selected from silicon nitride, aluminum nitride, zirconium nitride, titanium nitride, zinc nitride, magnesium nitride, gallium nitride, tantalum nitride, niobium nitride, bismuth nitride, yttrium nitride, iridium nitride, indium nitride, tin nitride, nickel nitride, and hafnium nitride. The nanoparticles are also preferably a nitride of at least an element selected from Group 4 elements, Group 10 elements, Group 12 elements, Group 13 elements, and Group 14 elements. Especially, silicon nitride is preferable.

An example in which the reflecting film 30 is included in the light reflecting structure body 25 has been mentioned so far, however, an embodiment of the present invention is not limited to this example. For example, the light reflecting structure body 25 may be omitted to make the first electrode portion 41 the reflecting film 30 so that the adhesion of the oxide or nitride to the protective film 45 can be increased. In addition, when the reflecting film 30 is formed in contact with a light-transmissive electrically conductive film formed of an electrically conductive oxide, the adhesion to the light-transmissive electrically conductive film can also be increased.

Hereinafter, an embodiment of the present invention is described in terms of constituents of a light emitting element.

Light Emitting Element 100

The light emitting element includes at least a semiconductor stacked body and a pair of electrodes, and further includes a substrate in many cases. Examples of the light emitting element include an LED element and a semiconductor laser (laser diode (LD)) element. The light emitting element is preferably a flip-chip type in which both p and n electrodes are provided on the same surface side. Although the shape of the light emitting element from a top view is preferably a tetragon, particularly a square or a rectangle that is long in one direction, from the viewpoint of productivity, and a hexagon is also preferable from the viewpoint of light emission efficiency, other shapes are also acceptable. A side surface of the light emitting element (particularly, the substrate) may be substantially orthogonal to an upper surface, or slanted inward or outward.

Semiconductor Stacked Body 10

The semiconductor stacked body includes at least an n-type semiconductor layer and a p-type semiconductor layer, and an active layer is preferably interposed between the n-type and p-type semiconductor layers. The wavelength of the light emitting element can be selected from an ultraviolet range to an infrared range according to the semiconductor material and the mixed crystal ratio of the semiconductor material. As the semiconductor material, a nitride semiconductor (mainly represented by the general formula $In_xAl_yGa_{1-x-y}N$, $0 \leq x$, $0 \leq y$, $x+y \leq 1$) is preferably used, which is a material capable of emitting light of a short wavelength that can efficiently excite a fluorescent material. In addition, an InAlGaAs semiconductor, an InAlGaP semiconductor, zinc sulfide, zinc selenide, silicon carbide, and the like can also be used.

Electrodes 40A and 40B

Each of the electrodes can be formed of a single layer film or a multilayer film of gold, silver, copper, tin, platinum, rhodium, titanium, aluminum, tungsten, palladium, nickel or alloys of these metals. The electrode may include a light-transmissive electrically conductive film (electrically conductive oxide film). As the light-transmissive electrically conductive film, at least one of ITO, IZO, AZO, GZO, and FTO can be used.

Protective Film 45

The protective film can be formed of an oxide or a nitride of at least an element selected from the group consisting of silicon, titanium, zirconium, niobium, tantalum, and aluminum.

Substrate 50

The substrate is preferably a substrate for crystal growth, which is capable of growing crystals of a semiconductor constituting the semiconductor stacked body (light emitting structure). The substrate has preferably light-transmissivity for efficiently extracting light. The substrate is any one of sapphire, spinel, gallium nitride, aluminum nitride, aluminum gallium nitride, silicon, silicon carbide, gallium arsenide, gallium phosphide, indium phosphide, zinc sulfide, zinc oxide, and zinc selenide. The thickness of the substrate is, for example, 20 µm or more and 1000 µm or less, and preferably 50 µm or more and 500 µm or less from the viewpoint of, for example, the whole thickness and the strength of the light emitting element.

Light Emitting Device

The light emitting device includes at least a base member, a light emitting element, and a sealing member. Specifically, the light emitting device is produced by, for example, flip-chip mounting the light emitting element on the base member and sealing with the sealing member. Particularly, in a surface-mounted light emitting device, the heat history of, for example, reflow soldering is relatively severe, easily causing the crystal growth of silver in the reflecting film, so that the configurations of the present embodiments are particularly effective.

Examples of the base member include a wiring board and a lead frame, and examples of the sealing member include a silicone resin. The sealing member may contain a fluorescent material.

EXAMPLES

Hereinafter, examples are described to confirm the effects of an embodiment of the present invention.

Example 1

A light emitting element of Example 1 is an LED element that includes a sapphire substrate and a nitride semiconductor stacked body on an upper surface of the sapphire substrate, is capable of emitting blue light (center wavelength: about 455 nm), and has a dimension of 460 μm (length)×460 μm (width)×120 μm (thickness). On a lower surface of the sapphire substrate of the light emitting element is formed a silicon oxide film (film thickness: 200 nm) and a reflecting film (film thickness: 120 nm) including silver as a main component and 4 wt % of zirconium oxide nanoparticles in this order. These films are formed by sputtering, and particularly, the reflecting film is formed by co-sputtering of silver and zirconium oxide. The zirconium oxide nanoparticles have a particle size of about 1 to 3 nm. The purity of silver is 99.99%, and the crystal grain size of silver is about 100 nm. Under the reflecting film is formed a bonding film obtained by stacking nickel (film thickness: 100 nm), rhodium (film thickness: 200 nm), and gold (film thickness: 500 nm). As a sputtering apparatus, SPF-530H manufactured by CANON ANELVA CORPORATION is used (the same applies to the following examples). Six light emitting elements prepared as described above are bonded onto a package lead frame with gold-tin solder as a bonding member (melting temperature: about 280° C., thickness: about 3.5 μm), and both p and n electrodes and the lead frame are connected by gold wire, to prepare a sample of a light emitting device before sealing. The package is configured by integrally molding an epoxy resin-made molded body including a titanium oxide white pigment, with a copper alloy-made pair of positive and negative lead frames a surface of which is plated with silver.

Comparative Example 1

Figure 5:
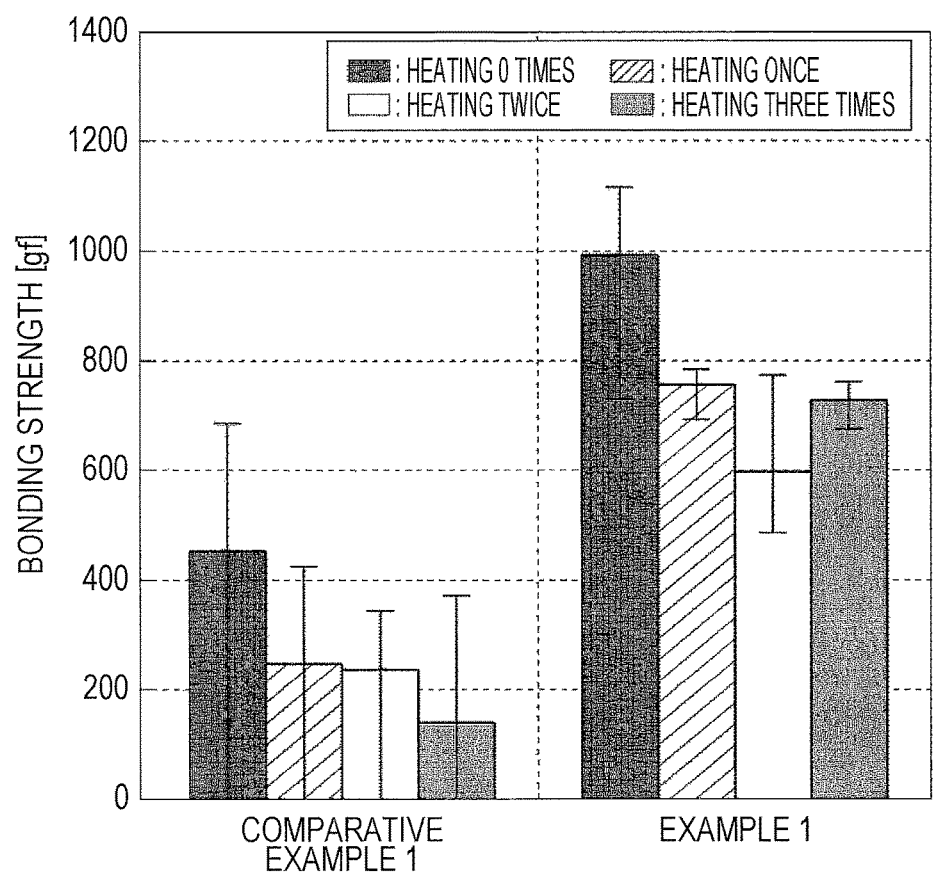
FIG. 5 is a graph that indicates the bonding strength of a reflecting film in an example and a comparative example.

A light emitting device of Comparative Example 1 is prepared by not adding the nanoparticles to the reflecting film in the light emitting device of Example 1.
Evaluation 1
The bonding strength (shear strength) of the light emitting element is measured for the light emitting devices of Example 1 and Comparative Example 1. The bonding strength is measured before the light emitting device is subjected to a heat treatment (reflow pass test of a peak temperature of 260° C. for 10 sec or less) (0 times), after subjected once, after subjected twice, and after subjected three times. The measurement results are shown in FIG. 5.
FIG. 5 is a graph that indicates the bonding strength of the reflecting film in Example 1 and Comparative Example 1. As shown in FIG. 5, the reflecting film of Example 1 is high in the bonding strength between the reflecting film and the silicon oxide film as compared with the reflecting film of Comparative Example 1. From the results, it is understood that the adhesion of the reflecting film to the silicon oxide film is increased by the presence of the zirconium oxide nanoparticles.

In the following examples and comparative examples, it is considered that the sapphire substrate is taken as a substitute for the silicon oxide film.

Example 2

A light emitting device of Example 2 is prepared by not forming the silicon oxide film in the light emitting device of Example 1.

Example 3

A light emitting device of Example 3 is prepared by changing, in the light emitting device of Example 2, the content of the zirconium oxide nanoparticles in the reflecting film to 2 wt %.

Example 4

A light emitting device of Example 4 is prepared by changing, in the light emitting device of Example 2, the content of the zirconium oxide nanoparticles in the reflecting film to 1 wt %.

Example 5

A light emitting device of Example 5 is prepared by changing, in the light emitting device of Example 2, the content of the zirconium oxide nanoparticles in the reflecting film to 0.5 wt %.

Comparative Example 2

Figure 6:
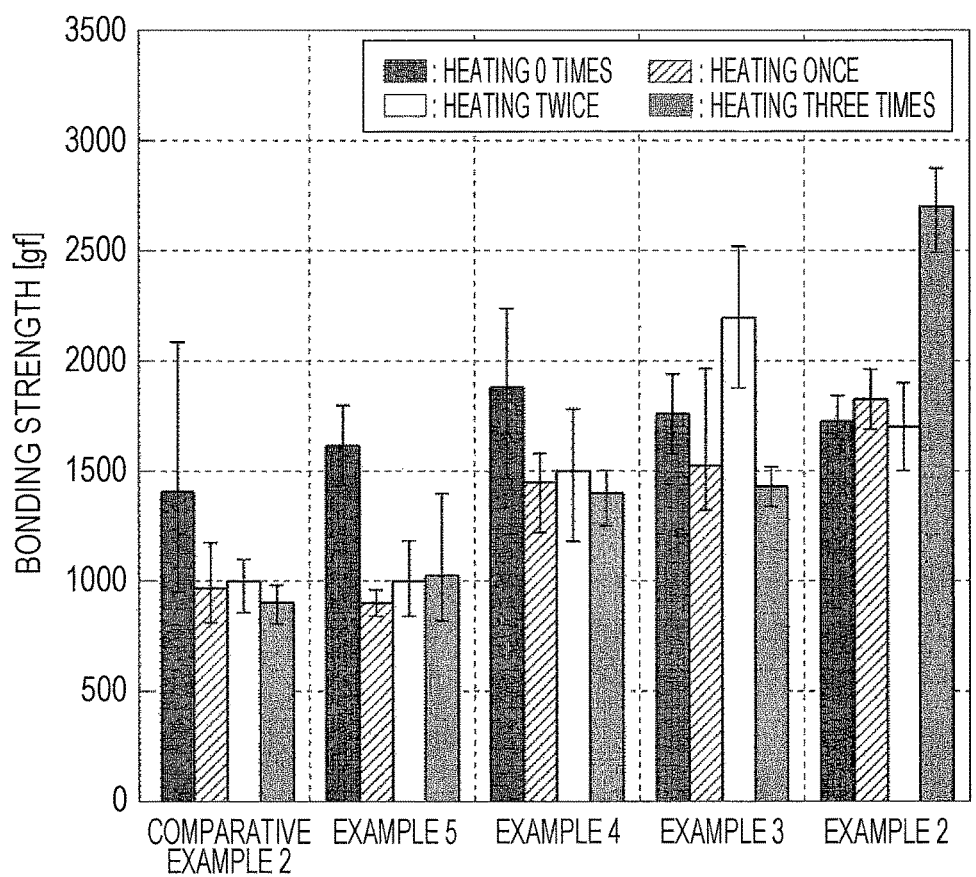
FIG. 6 is a graph that indicates the bonding strength of a reflecting film in examples and a comparative example.

A light emitting device of Comparative Example 2 is prepared by not adding the nanoparticles to the reflecting film in the light emitting device of Example 2.
Evaluation 2
The bonding strength (shear strength) of the light emitting element is measured for the light emitting devices of Examples 2 to 5 and Comparative Example 2. The bonding strength is measured before the light emitting device is subjected to a heat treatment (reflow pass test of a peak temperature of 260° C. for 10 sec or less) (0 times), after subjected once, after subjected twice, and after subjected three times. The measurement results are shown in FIG. 6.
FIG. 6 is a graph that indicates the bonding strength of the reflecting film in Examples 2 to 5 and Comparative Example 2. As shown in FIG. 6, the reflecting films of Examples 2 to 5 are high in the bonding strength as compared with the reflecting film of Comparative Example 2, and the bonding strength is observed to rise along with the increase of the content of the zirconium oxide nanoparticles in the reflecting film From the results, it is understood that the adhesion of the reflecting film to the substrate is increased by the presence of the zirconium oxide nanoparticles. In the light emitting device of Comparative Example 2, many fractures are observed in the interface between the substrate and the reflecting film, while in the light emitting devices of Examples 2 to 5, many fractures are observed in a portion of the bonding member.

Example 6

As Example 6, a 100-nm-thick titanium film is formed by sputtering on an upper surface of a test substrate, or a piece of slide glass (separation type) 1-9645-01 manufactured by AS ONE Corporation, and as a sample of the reflecting film, a 500-nm-thick film including silver as a main component and 4.1 wt % of aluminum oxide nanoparticles is formed on the titanium film.

Process conditions are as follows. The ultimate pressure before a process is 5.0 e-4 Pa. Before the formation of the films, the upper surface of the test substrate is subjected to cleaning by reverse sputtering under the conditions of RF 250 W, 1 min, 0.5 Pa, and Ar: 50 sccm. The titanium film is formed by using a titanium sputtering target having a diameter of 4 in under the conditions of RF 500 W, 18 min 35 sec, 0.5 Pa, and Ar: 50 sccm. The sample of the reflecting film is forming by co-sputtering of an aluminum oxide sputtering target having a diameter of 4 in under the condition of RF 100 W and a silver sputtering target having a diameter of 4 in under the conditions of RF 60 W, 120 min, 0.5 Pa, and Ar: 50 sccm. The holder for the test substrate is rotated at 6 rpm and cooled at about normal temperature during the formation of the films.

Figure 7:
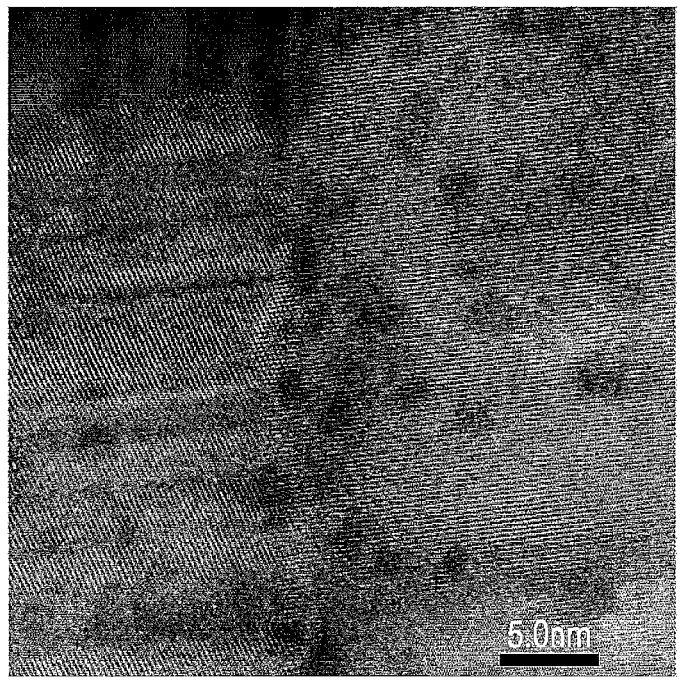
FIG. 7 is an image observed by a scanning transmission electron microscope in a section of a reflecting film in an example.

FIG. 7 is an image observed by a scanning transmission electron microscope (JEM-ARM200F (Cold-FEG) manufactured by JEOL Ltd.) in a section of the reflecting film in Example 6. As shown in FIG. 7, in the reflecting film of Example 6, the aluminum oxide nanoparticles (black dots in FIG. 7) are present in a grain boundary of silver. The aluminum oxide nanoparticles are also present in a region other than the grain boundary of silver in the reflecting film. The aluminum oxide nanoparticles have a particle size of about 1.0 to 3.0 nm.

Example 7

A sample of Example 7 is prepared by changing, in the sample of Example 6, the content of the aluminum oxide nanoparticles in the reflecting film to 2.5 wt %.

Comparative Example 3

A sample of Comparative Example 3 is prepared by not adding the nanoparticles to the reflecting film in the sample of Example 6.

Evaluation 3

The reflectivity of the reflecting film before and after a heat treatment (conditions: atmosphere, 250° C., 2 h) is measured for the samples of Examples 6 and 7 and Comparative Example 3. The measurement wavelength is 450 nm. The measurement results are shown in Table 1.

TABLE 1

|  | Example 6 | Example 7 | Comparative Example 3 |
| --- | --- | --- | --- |
| Content of nanoparticles [wt %] | 4.1 | 2.5 | 0 |
| Reflectivity [%] Before heating | 90.6 | 95.5 | 97.0 |
| After heating | 89.9 | 94.9 | 90.7 |
| Reflectivity retention rate [%] | 99.2 | 99.4 | 93.5 |

As shown in Table 1, the reflectivity hardly changes before and after the heat treatment in the reflecting films of Examples 6 and 7, and the crystal growth caused by a heat history of the reflecting films is reduced by the presence of aluminum oxide nanoparticles. Further, it is understood that a high initial reflectivity can easily be obtained and the reflectivity is likely to be retained by setting the content of the nanoparticles in the reflecting film to, for example, 4 wt % or less.

Example 8

A sample of Example 8 is prepared by changing, in the sample of Example 6, the nanoparticles to zirconium oxide nanoparticles. The reflectivity of the reflecting film in Example 8 is 92.6% before a heat treatment (conditions: the same as above) and 89.8% after the heat treatment, and the reflectivity retention rate is 97.0%. In the reflecting film of Example 8, the decrease in the reflectivity before and after the heat treatment is reduced as compared with the case of Comparative Example 3, and the crystal growth by a heat history of the reflecting film is reduced by the presence of the zirconium oxide nanoparticles.

Hereinafter, the adhesion to the substrate is evaluated for reflecting films containing nanoparticles other than the zirconium oxide nanoparticles.

Example 9

A light emitting device of Example 9 is prepared by changing, in the light emitting device of Example 2, the nanoparticles in the reflecting film to zinc oxide nanoparticles.

Example 10

A light emitting device of Example 10 is prepared by changing, in the light emitting device of Example 2, the nanoparticles in the reflecting film to nickel oxide nanoparticles.

Example 11

A light emitting device of Example 11 is prepared by changing, in the light emitting device of Example 2, the nanoparticles in the reflecting film to hafnium oxide nanoparticles.

Comparative Example 4

A light emitting device of Comparative Example 4 is prepared by not adding the nanoparticles to the reflecting film in the light emitting device of Example 9.

Example 12

A light emitting device of Example 12 is prepared by changing, in the light emitting device of Example 2, the nanoparticles in the reflecting film to tin oxide nanoparticles.

Example 13

A light emitting device of Example 13 is prepared by limiting, in the light emitting device of Example 2, the zirconium oxide nanoparticles in the reflecting film to particles discretely attached to a lower surface of the substrate. This reflecting film is formed by forming extremely thin zirconium oxide (in a thickness of about a few nm) by sputtering to discretely attach the zirconium oxide nanoparticles to the lower surface of the substrate, and then forming a silver film on the zirconium oxide nanoparticles by sputtering.

Comparative Example 5

A light emitting device of Comparative Example 5 is prepared by not adding the nanoparticles to the reflecting film in the light emitting device of Example 12.

Evaluation 4

The bonding strength (shear strength) of the light emitting element is measured for the light emitting devices of Examples 9 to 13 and Comparative Examples 4 and 5. The bonding strength is measured before the light emitting device is subjected to a heat treatment (reflow pass test of a peak temperature of 260° C. for 10 sec or less) (0 times), after subjected once, after subjected twice, and after subjected three times. The measurement results are shown in FIGS. 8 and 9.

Figure 8:
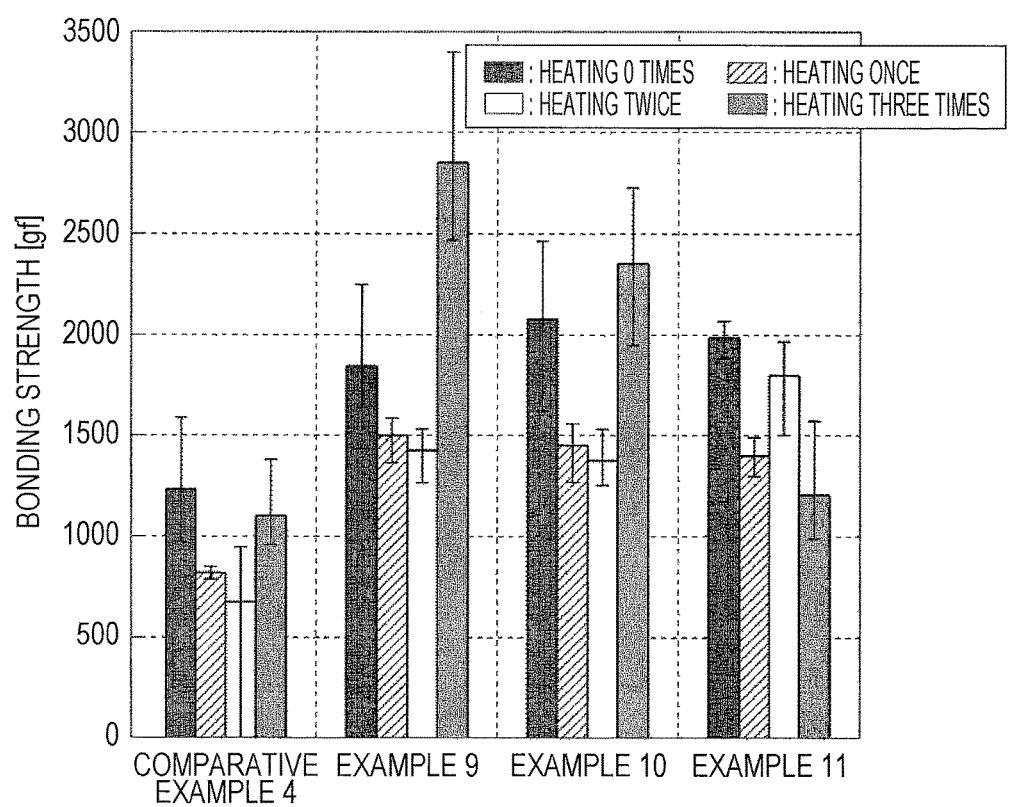
FIG. 8 is a graph that indicates the bonding strength of a reflecting film in examples and a comparative example.
Figure 9:
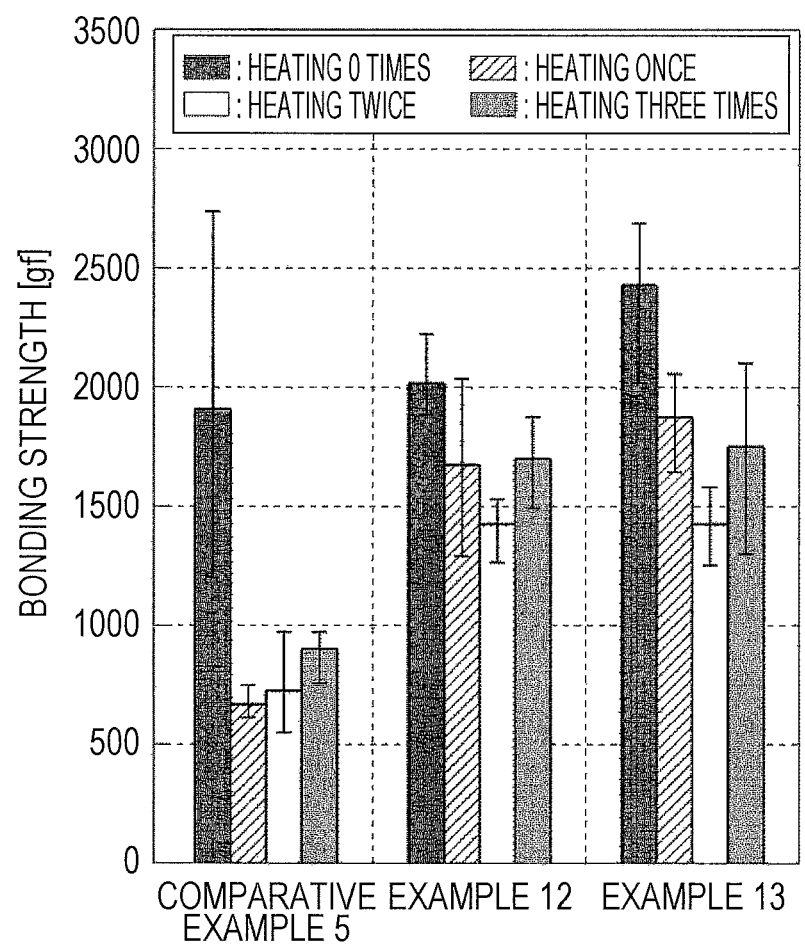
FIG. 9 is a graph that indicates the bonding strength of a reflecting film in examples and a comparative example.

FIG. 8 is a graph that indicates the bonding strength of the reflecting film in Examples 9 to 11 and Comparative Example 4. FIG. 9 is a graph that indicates the bonding strength of the reflecting film in Examples 12 and 13 and Comparative Example 5. As shown in FIGS. 8 and 9, the reflecting films of Examples 9 to 13 are high in the bonding strength as compared with the reflecting films of Comparative Examples 4 and 5. From the results, it is understood that the adhesion to the substrate is also increased in the reflecting films containing nanoparticles of zinc oxide, nickel oxide, hafnium oxide, and tin oxide. It is also understood that the adhesion to the substrate is also increased in the reflecting film containing the zirconium oxide nanoparticles which are discretely attached to the lower surface of the substrate.

Example 14

As Example 14, a 50-nm-thick titanium film is forming by sputtering on an upper surface of a piece of slide glass, and as a sample of the reflecting film, a 500-nm-thick film including silver as a main component and 4 wt % of zirconium oxide nanoparticles is formed on the titanium film by co-sputtering, in the same manner as in Example 6.

Example 15

Example 15 is prepared by changing, in Example 14, the nanoparticles in the reflecting film to hafnium oxide nanoparticles.
Evaluation 5

Figure 10A:
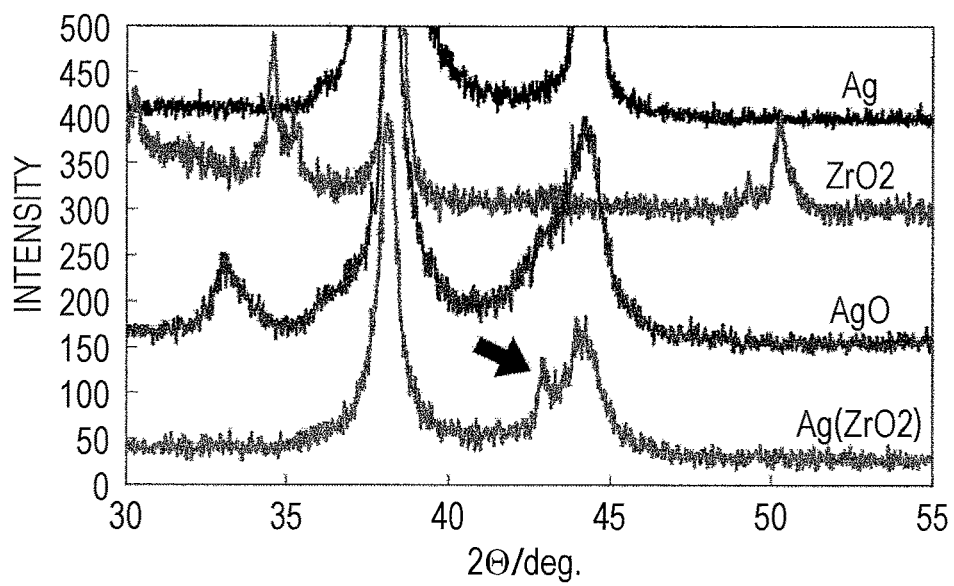
FIG. 10A is a graph that indicates the results of X-ray diffraction measurement of a reflecting film in an example.
Figure 10B:
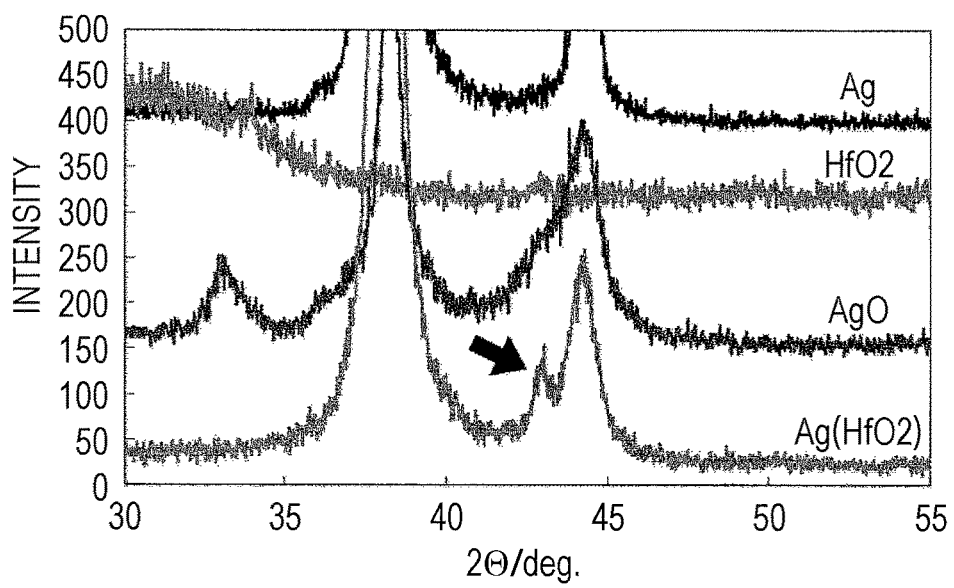
FIG. 10B is a graph that indicates the results of X-ray diffraction measurement of a reflecting film in an example.

FIGS. 10A and 10B are graphs that indicate the results of X-ray diffraction (XRD) measurement of the reflecting film in Examples 14 and 15, respectively. As shown in FIGS. 10A and 10B, a unique peak is observed at around 43° in the reflecting films of Examples 14 and 15. From the results, it is assumed that a silver-zirconium or silver-oxygen-zirconium chemical bonding or composite oxide is present in the reflecting film of Example 14, and a silver-hafnium or silver-oxygen-hafnium chemical bonding or composite oxide is present in the reflecting film of Example 15, which are considered to be a factor to increase the adhesion to the substrate.

Figure 11:
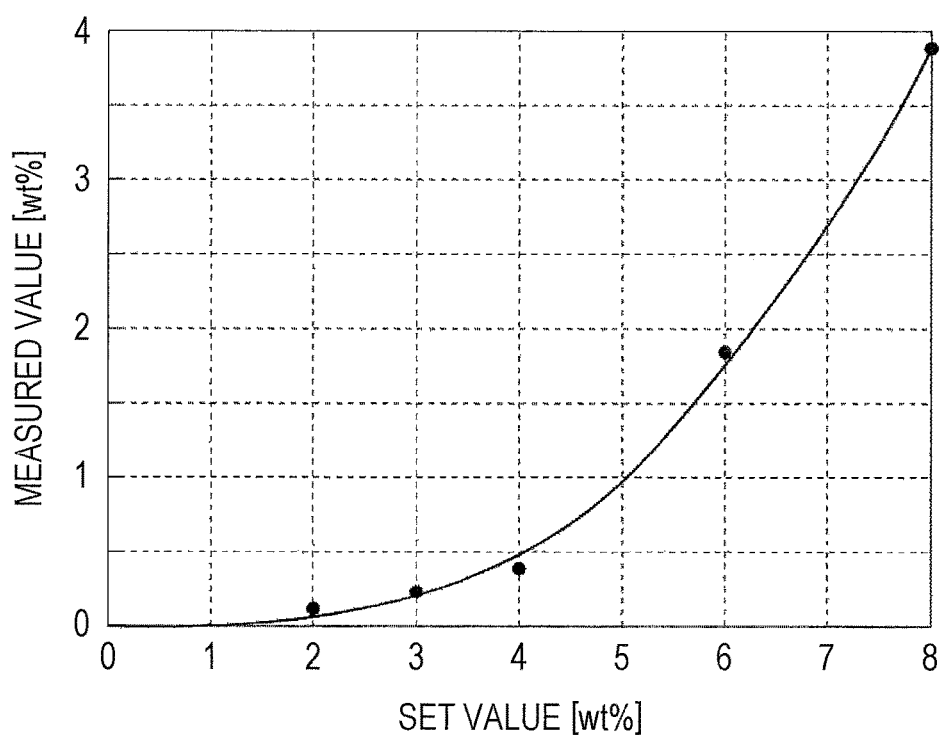
FIG. 11 is a graph that indicates the relationship between the set value in a sputtering apparatus for the content of nanoparticles in a reflecting film and the measured value by an inductively coupled plasma-atomic emission spectrometer.

Last, FIG. 11 is a graph that indicates the relationship between the set value in a sputtering apparatus for the content of the nanoparticles in the reflecting film and the measured value by an inductively coupled plasma-atomic emission spectrometer (ICP-AES apparatus). As shown in FIG. 11, the measured value of the content of the nanoparticles in the reflecting film is smaller than the set value in the sputtering apparatus, and it is understood that a normal linear relationship is not obtained.

This is because it is necessary to set the power of RF in the sputtering apparatus relatively low for controlling the content of the nanoparticles in the reflecting film to a small amount. The nanoparticles referred to is zirconium oxide nanoparticles, however, other nanoparticles also have the same tendency. The values of the content of the nanoparticles in the reflecting film in the embodiments and examples indicated above are all set values in the film-forming apparatus. Accordingly, the content of the nanoparticles in the reflecting film is, for example, 1 wt % or less, preferably 0.5 wt % or less as measured values.

A light emitting element according to an embodiment of the present invention can be used for a backlight light source of a liquid crystal display, various lighting apparatuses, a large-size display, various display devices for, for example, advertisement and a destination guide, and a projector, and can be further used for image reading apparatuses such as a digital video camera, a facsimile, a copying machine, and a scanner, and various sensors.

Obviously, numerous modifications and variations of the present invention are possible in light of the above teachings. It is therefore to be understood that within the scope of the appended claims, the invention may be practiced otherwise than as specifically described herein.

What is claimed is:

1. A light emitting element comprising:
a semiconductor stacked body having a body surface;
an oxide film having an upper surface and a bottom surface opposite to the upper surface, the oxide film being provided on the semiconductor stacked body such that the bottom surface of the oxide film is proximate to the body surface of the semiconductor stacked body; and
a reflecting film provided on the oxide film to be in contact with the upper surface of the oxide film and comprising silver and oxide nanoparticles, the reflecting film having a plurality of silver crystal grains, oxide nanoparticles being directly adhered to an upper surface of the oxide film such that at least one of the oxide nanoparticles is provided in a grain boundary of each of the silver crystal grains.

2. The light emitting element according to claim 1, wherein the oxide film is a film including at least one substance selected from silicon oxide, aluminum oxide, zirconium oxide, titanium oxide, zinc oxide, magnesium oxide, gallium oxide, tantalum oxide, niobium oxide, bismuth oxide, yttrium oxide, iridium oxide, indium oxide, tin oxide, nickel oxide, hafnium oxide, ITO, IZO, AZO, GZO, and FTO.

3. The light emitting element according to claim 1, wherein the oxide nanoparticles are particles including at least one substance selected from silicon oxide, aluminum oxide, zirconium oxide, titanium oxide, zinc oxide, magnesium oxide, gallium oxide, tantalum oxide, niobium oxide, bismuth oxide, yttrium oxide, iridium oxide, indium oxide, tin oxide, nickel oxide, hafnium oxide, ITO, IZO, AZO, GZO, and FTO.

4. The light emitting element according to claim 1, wherein the reflecting film has a first side facing the oxide film and a second side opposite to the first side, and
wherein the oxide nanoparticles are denser in the first side than in the second side.

5. The light emitting element according to claim 1, wherein a content of the oxide nanoparticles in the reflecting film is 1 wt % or less.

6. The light emitting element according to claim 1, wherein the reflecting film comprises silver as a main component.

7. The light emitting element according to claim 1, wherein the semiconductor stacked body comprises
a second electrically conductive semiconductor layer having the body surface;
an active layer stacked on the second electrically conductive semiconductor layer opposite to the body surface; and
a first electrically conductive semiconductor layer stacked on the active layer such that the active layer is sandwiched between the second electrically conductive semiconductor layer and the first electrically conductive semiconductor layer, and
wherein the light emitting element further comprises
a first electrode portion provided on the first electrically conductive semiconductor layer opposite to the active layer; and
a second electrode portion electrically connected to the first electrode portion such that the second electrode portion is electrically connected to the reflecting film.

8. A light emitting element comprising:
a semiconductor stacked body having a body surface;
a nitride film having an upper surface and a bottom surface opposite to the upper surface, the nitride film being provided on the semiconductor stacked body such that the bottom surface of the nitride film is proximate to the body surface of the semiconductor stacked body; and
a reflecting film provided on the nitride film to be in contact with the upper surface of the nitride film and comprising silver and nitride nanoparticles, the reflecting film having a plurality of silver crystal grains, nitride nanoparticles being directly adhered to an upper surface of the nitride film such that at least one of the nitride nanoparticles is provided in a grain boundary of each of the silver crystal grains.

9. The light emitting element according to claim 8, wherein the nitride film is a film including at least one substance selected from silicon nitride, aluminum nitride, zirconium nitride, titanium nitride, zinc nitride, magnesium nitride, gallium nitride, tantalum nitride, niobium nitride, bismuth nitride, yttrium nitride, iridium nitride, indium nitride, tin nitride, nickel nitride, and hafnium nitride.

10. The light emitting element according to claim 8, wherein the nitride nanoparticles are particles including at least one substance selected from silicon nitride, aluminum nitride, zirconium nitride, titanium nitride, zinc nitride, magnesium nitride, gallium nitride, tantalum nitride, niobium nitride, bismuth nitride, yttrium nitride, iridium nitride, indium nitride, tin nitride, nickel nitride, and hafnium nitride.

11. The light emitting element according to claim 8,
wherein the reflecting film has a third side facing the nitride film and a fourth side opposite to the third side, and
wherein the nitride nanoparticles are denser in the third side than in the fourth side.

12. The light emitting element according to claim 8, wherein a content of the nitride nanoparticles in the reflecting film is 1 wt % or less.

13. The light emitting element according to claim 8, wherein the reflecting film comprises silver as a main component.

14. The light emitting element according to claim 8,
wherein the semiconductor stacked body comprises
a second electrically conductive semiconductor layer having the body surface;
an active layer stacked on the second electrically conductive semiconductor layer opposite to the body surface; and
a first electrically conductive semiconductor layer stacked on the active layer such that the active layer is sandwiched between the second electrically conductive semiconductor layer and the first electrically conductive semiconductor layer, and
wherein the light emitting element further comprises
a first electrode portion provided on the first electrically conductive semiconductor layer opposite to the active layer; and
a second electrode portion electrically connected to the first electrode portion such that the second electrode portion is electrically connected to the reflecting film.

15. A method of manufacturing a light emitting element, comprising:
providing a semiconductor stacked body having a body surface;
providing an oxide film on the semiconductor stacked body such that a bottom surface of the oxide film is proximate to the body surface of the semiconductor stacked body; and
providing a reflecting film on the oxide film to be in contact with an upper surface of the oxide film opposite to the bottom surface of the oxide film by co-sputtering or co-vapor deposition of silver and an oxide, the reflecting film having a plurality of silver crystal grains, oxide nanoparticles being directly adhered to an upper surface of the oxide film such that at least one of the oxide nanoparticles is provided in a grain boundary of each of the silver crystal grains.

16. A method of manufacturing a light emitting element, comprising:
providing semiconductor stacked body having a body surface;
providing an oxide film on the semiconductor stacked body such that a bottom surface of the oxide film is proximate to the body surface of the semiconductor stacked body; and
providing a reflecting film on the oxide film to be in contact with an upper surface of the oxide film opposite to the bottom surface of the oxide film by discretely attaching oxide nanoparticles to the upper surface of the oxide film by sputtering or vapor deposition and by forming a silver film covering the oxide nanoparticles, the reflecting film having a plurality of silver crystal grains, oxide nanoparticles being directly adhered to an upper surface of the oxide film such that at least one of the oxide nanoparticles is provided in a grain boundary of each of the silver crystal grains.

17. A method of manufacturing a light emitting element, comprising:
providing semiconductor stacked body having a body surface;
providing a nitride film on the semiconductor stacked body such that a bottom surface of the nitride film is proximate to the body surface of the semiconductor stacked body; and
providing a reflecting film on the nitride film to be in contact with an upper surface of the nitride film opposite to the bottom surface of the nitride film by co-sputtering or co-vapor deposition of silver and a nitride, the reflecting film having a plurality of silver crystal grains, nitride nanoparticles being directly adhered to an upper surface of the nitride film such that at least one of the nitride nanoparticles is provided in a grain boundary of each of the silver crystal grains.

18. A method of manufacturing a light emitting element, comprising:
providing semiconductor stacked body having a body surface;
providing a nitride film on the semiconductor stacked body such that a bottom surface of the nitride film is proximate to the body surface of the semiconductor stacked body; and
providing a reflecting film on the nitride film to be in contact with an upper surface of the nitride film opposite to the bottom surface of the nitride film by discretely attaching nitride nanoparticles to the upper surface of the nitride film by sputtering or vapor deposition and by forming a silver film covering the nitride nanoparticles, the reflecting film having a plurality of silver crystal grains, nitride nanoparticles being directly adhered to an upper surface of the nitride film such that at least one of the nitride nanoparticles is provided in a grain boundary of each of the silver crystal grains.

* * * * *